(12) United States Patent
Walker

(10) Patent No.: US 8,369,168 B2
(45) Date of Patent: Feb. 5, 2013

(54) DEVICES AND SYSTEM PROVIDING REDUCED QUANTITY OF INTERCONNECTIONS

(75) Inventor: Robert M. Walker, Raleigh, NC (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 13/279,513

(22) Filed: Oct. 24, 2011

(65) Prior Publication Data

US 2012/0057421 A1 Mar. 8, 2012

Related U.S. Application Data

(62) Division of application No. 12/042,518, filed on Mar. 5, 2008, now Pat. No. 8,045,416.

(51) Int. Cl.
*G11C 7/12* (2006.01)
*G11C 8/00* (2006.01)

(52) U.S. Cl. .................. 365/203; 365/230.1

(58) Field of Classification Search ............ None
See application file for complete search history.

(56) References Cited

U.S. PATENT DOCUMENTS

| | | | |
|---|---|---|---|
| 5,627,791 A | 5/1997 | Wright et al. | |
| 6,192,446 B1 | 2/2001 | Mullarkey et al. | |
| 6,198,686 B1 | 3/2001 | Takita et al. | |
| 6,260,104 B1 | 7/2001 | Roohparvar | |
| 6,266,734 B1 | 7/2001 | LaBerge | |
| 6,327,209 B1 | 12/2001 | Schaefer | |
| 6,363,446 B1 | 3/2002 | Larson | |
| 6,363,447 B1 | 3/2002 | Larson | |
| 6,478,231 B1 | 11/2002 | Taussig | |
| 6,771,553 B2 | 8/2004 | Cowles et al. | |
| 6,931,479 B2* | 8/2005 | Choi | 711/5 |
| 6,947,346 B2 | 9/2005 | Shore et al. | |
| 7,073,034 B2 | 7/2006 | Kirsch | |
| 7,197,607 B2 | 3/2007 | Roohparvar | |
| 7,289,384 B2 | 10/2007 | Cowles et al. | |
| 2004/0193777 A1 | 9/2004 | LaBerge | |
| 2005/0002254 A1* | 1/2005 | Otsuka et al. | 365/222 |
| 2005/0052910 A1 | 3/2005 | Bell | |
| 2005/0088902 A1 | 4/2005 | LaBerge | |
| 2006/0039204 A1 | 2/2006 | Cornelius | |
| 2006/0041713 A1 | 2/2006 | Charles et al. | |
| 2006/0245203 A1* | 11/2006 | Louie et al. | 365/189.05 |
| 2008/0025127 A1 | 1/2008 | Kanda et al. | |
| 2008/0106967 A1* | 5/2008 | Oh | 365/230.06 |

* cited by examiner

*Primary Examiner* — Hoai V Ho
*Assistant Examiner* — James G Norman
(74) *Attorney, Agent, or Firm* — TraskBritt

(57) ABSTRACT

Methods, devices and systems for reducing the quantity of external interconnections of a memory device are disclosed. Implementation of one such method, device and system includes inputting over an address bus a first portion of an address of a next row of memory cells to be activated. The first portion of the address of the next row of memory cells to be activated is embedded in a command related to the previously activated row of memory cells. The next row of memory cells is subsequently activated according to a concurrently received second portion of the address of the next row of memory cells also received over the address bus. The portioning of the address signals can reduce the width of the address bus and, therefore, the number of required respective external interconnections.

11 Claims, 9 Drawing Sheets

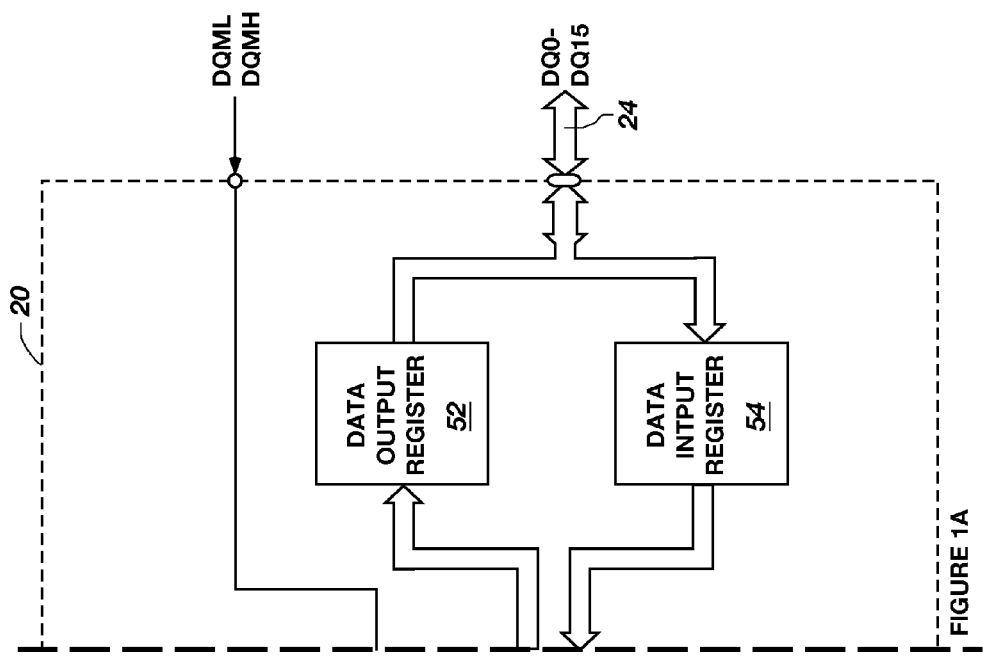

| Cmd | A0 | A1 | A2 | A3 | A4 | A5 | A6 | A7 | A8 | A9 | A10 | A11 | A12 | A13 | A14 |
|---|---|---|---|---|---|---|---|---|---|---|---|---|---|---|---|
| Active | A0 | A1 | A2 | A3 | A4 | A5 | A6 | A7 | A8 | A9 | A10 | A11 | A12 | A13 | A14 |
| Precharge | res | res | res | res | res | res | res | res | res | res | res | res | res | res | res |
| Refresh | res | res | res | res | res | res | res | res | res | res | res | res | res | res | res |

*FIG. 2*

| Cmd | A0 | A1 | A2 | A3 | A4 | A5 | A6 | A7 | A8 |
|---|---|---|---|---|---|---|---|---|---|
| ACT_L | A0 | A1 | A2 | A3 | A4 | A5 | A6 | A7 | A8 |
| Precharge/ACT_U | A9 | A10 | A11 | A12 | A13 | A14 | res | res | res |
| Refresh/ACT_U | A9 | A10 | A11 | A12 | A13 | A14 | res | res | res |

FIG. 4

DEVICES AND SYSTEM PROVIDING REDUCED QUANTITY OF INTERCONNECTIONS

CROSS-REFERENCE TO RELATED APPLICATION

This application is a divisional of U.S. patent application Ser. No. 12/042,518, filed Mar. 5, 2008, now U.S. Pat. No. 8,045,416 issued Oct. 25, 2011, the disclosure of which is hereby incorporated herein by this reference in its entirety.

TECHNICAL FIELD

The present invention relates to semiconductor memory integrated circuits. More particularly, one or more embodiments of the present invention relate to an architecture for reducing the quantity of inputs to a memory device, including synchronous random access memories, such as synchronous dynamic random access memories.

BACKGROUND

Memory devices require a plurality of inputs and outputs through which data enters and exits the memory cells contained therein. Included among the various inputs and outputs are command, addressing and data signals. These signals are used to identify and access data storage locations (e.g., memory cells) within the memory device. As the quantity of memory cells increases, the number of input signals necessary to uniquely identify a memory cell also increases. Specifically, an address bus includes a sufficiently large quantity of address lines for uniquely identifying each of the memory cells in the memory device. Therefore, as the quantity of memory cells increases on the memory device, the quantity of inputs necessary for accessing the memory cells also increases.

Furthermore, since each of the input and output signals needs to be externally accessible for interfacing with external components such as memory controllers and the like, the periphery around the memory device must remain sufficiently large to accommodate external interconnections (e.g., pins) that are coupled to the input and output signals. As is readily appreciated, an increase in the quantity of interconnection pins to adequately address or select an increased density of memory cells creates a conflict with design motivations of further circuit miniaturization and integration. Therefore, there is a need for a memory device interface architecture that reduces the quantity of external interconnections required for input and output signals without introducing significant delay in accessing the memory cells in a memory device.

BRIEF DESCRIPTION OF THE DRAWINGS

FIGS. 1A and 1B illustrate a block diagram of an SDRAM circuit.

FIG. 2 represents an address bus configuration during various memory commands for accessing the memory system described herein.

FIG. 4 represents an address bus configuration during various memory commands for accessing the memory system, in accordance with an embodiment of the present invention.

DETAILED DESCRIPTION

Figure 1A:
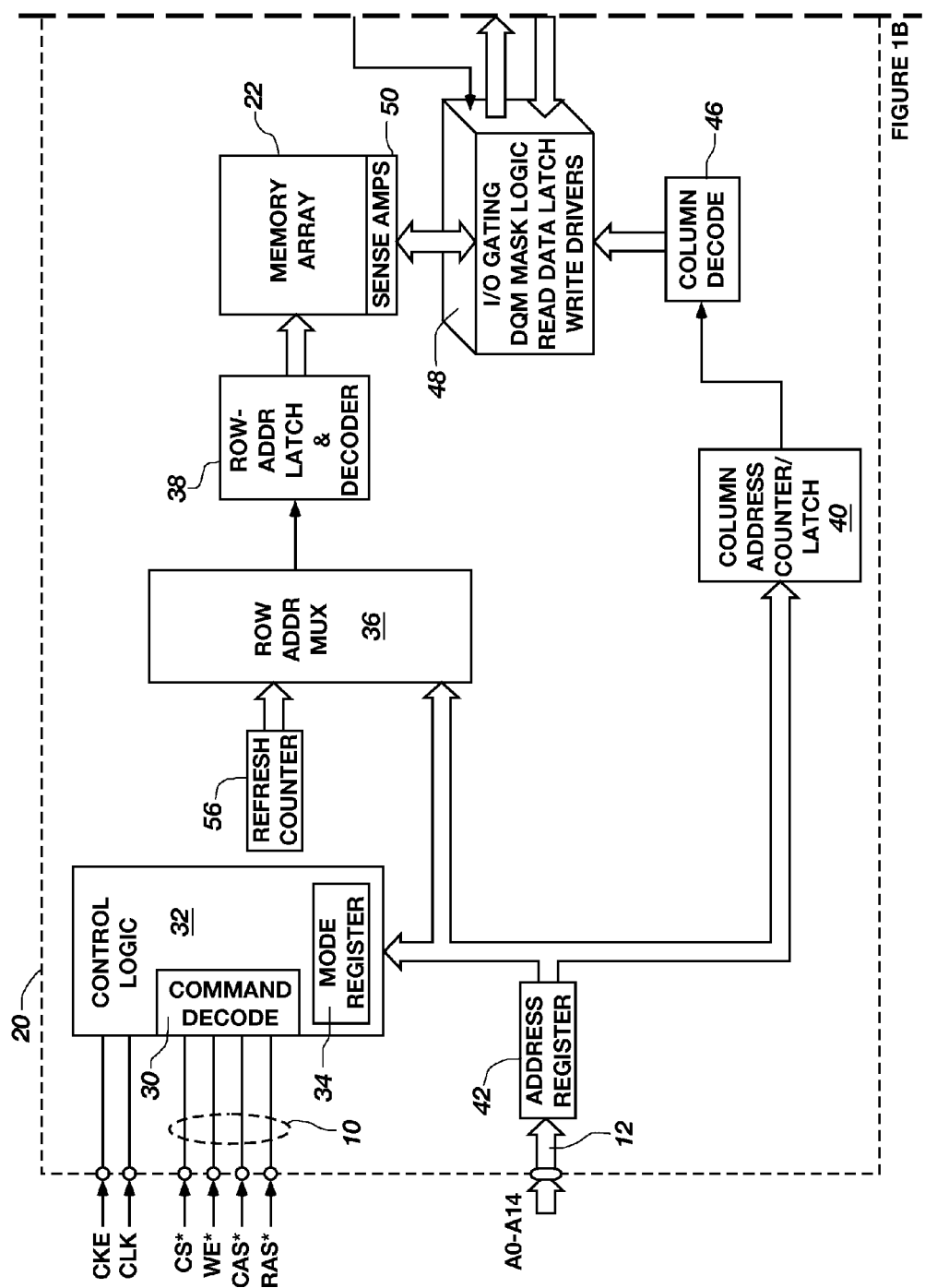

While the various embodiments described herein find application to various types of paged or segmented array architectures, this specification utilizes a synchronous dynamic random access memory (SDRAM) for purposes of illustration. Nevertheless, it will be understood by those of ordinary skill in the art that the various embodiments apply to memory architectures such as video random access memories (VRAMs) synchronous graphic random access memories (SGRAMs), Rambus memory systems, Synchlink memory systems, and double or multiple data rate memories.

Synchronous memories such as SDRAMs are designed to operate in a synchronous memory system, where input and output signals are synchronized to an active edge of a system clock (one exception in a SDRAM being a clock enable signal as used during power-down and self-refresh modes). The address operations of a SDRAM are somewhat different from those of an asynchronous DRAM. In an asynchronous DRAM, once row and column addresses are issued to the DRAM and the row and column address strobe signals are deactivated, the DRAM's memory is automatically precharged and available for another access. A SDRAM, on the other hand, requires a separate command to precharge a row of storage cells within a memory array. Assuming one of the memory cells in a SDRAM has been addressed, that page remains active even after the cell has been accessed. This occurs because an internal row address strobe is generated and maintains the active state of the addressed page. As a result, the page remains open until a PRECHARGE command is used to deactivate the open page and put the memory device into a standby mode.

Thus, to accomplish a SDRAM data transfer operation, an ACTIVE command is issued to register a row address designated by the ADDRESS signals (e.g., A0-A14 for a $2^{15}$-page memory device), and a memory page is selected to be accessed. Data is then transferred to or from the memory page by registering the column address through a WRITE or READ command, respectively. Other memory pages may be subsequently accessed, but a PRECHARGE command is needed with the present embodiment before registering another row or page in that memory device. As used herein, a "page" is that portion of a row of memory cells that are accessed at a given time, which in some embodiments, could consist of the entire row. Further, a "row" refers to cells whose access devices are commonly coupled, and does not require a particular physical relationship between the cells of the row (e.g., they do not have to be in a straight line or in a particular orientation on a die). Columns may also be similarly configured.

Conventionally, the width of the ADDRESS bus of the memory device has been determined by the number of rows or pages in the memory device. Generally, the quantity of rows tends to be greater than the quantity of columns in the memory device. As stated, as a memory device increases in density or quantity of memory cells, the quantity of external interconnections (e.g., pins) that are required to implement the input and output interface with the memory device also increases. Furthermore, an increase in the quantity of external interconnections forming the external interface creates further burdens on controllers and other devices that electrically couple with the external interconnections.

In order to describe the embodiments, it is necessary to go into some detail with respect to one nonlimiting example of a memory system in which the various embodiments find application. FIGS. 1A and 1B, for example, depict a block diagram of a SDRAM 20 including, for example, storage cells forming a memory array 22 organized in 32,768 rows and thirty-two 8-bit columns. Much of the circuitry of SDRAM 20 is similar to the circuitry in known SDRAMs. Power is supplied to SDRAM 20 through pins $V_{CC}$ and $V_{SS}$ (not shown). A system clock signal CLK is provided through a CLK input pin, and a clock enable signal CKE is provided through a CKE pin of SDRAM 20. The CLK signal activates and deactivates based on the state of the CKE signal. For purposes of explaining the present invention, it is assumed that all input and output signals of SDRAM 20, with the exception of the CKE signal during power-down and self-refresh modes, are synchronized to the positive-rising edge of the CLK signal.

A chip select signal (CS*) is input through a CS* input pin. When CS* is low, it enables a command decoder 30. Command decoder 30 is included as a part of control logic circuitry 32 and receives control signals on a command bus 10. These control signals on command bus 10 include a row address strobe (RAS*), a column address strobe (CAS*), and a write enable signal (WE*). The command decoder 30 decodes RAS*, CAS*, and WE* to place the control logic circuitry 32 in a particular command operation mode.

Address bits are provided by inputs A0-A14 for row addresses and inputs A0-A14 are stored in an address register 42 before they are sent to other portions of the SDRAM 20. During a WRITE operation, data to be stored is supplied to SDRAM 20 through input/output pins DQ0-DQ15. During a READ operation, data is clocked out of SDRAM 20 through DQ0-DQ15. An input/output mask signal DQM is provided as an input mask signal for write operations and as an output enable signal during read operations.

Mode register 34 is a part of control logic circuitry 32 that defines the specific mode of operation of SDRAM 20. Based on the state of input signals CS*, RAS*, CAS*, and WE*, the mode register 34 will determine whether SDRAM 20 is in an ACTIVE, WRITE, READ, PRECHARGE, or REFRESH mode.

In conjunction with FIGS. 1A and 1B, FIG. 2 depicts a partial command structure for accessing the memory system described herein. Before any READ or WRITE commands can be issued to a memory array such as that disclosed in the present embodiment, a row in that array is activated. This is accomplished through the ACTIVE command, which is initiated, for example, by low CS* and RAS* signals in combination with high CAS* and WE* signals occurring during the rising edge of the CLK signal. During the ACTIVE command, a value representing the row address is indicated by inputs A0-A14 as illustrated in FIG. 2 and provided to row address multiplexer 36, again by way of address register 42. The row address multiplexer 36, in turn, provides the row address inputs to latch and decoder circuitry 38 corresponding to the appropriate memory page. Accordingly, the latch and decoder circuitry 38 will latch the row address identified by inputs A0-A14, decode the row address, and activate one of the memory device's 32,768 pages or row lines corresponding to that address. According to the present embodiment, a subsequent ACTIVE command to a different page or row in the same memory array 22 can only be issued after the previous active page or row has been closed with a PRECHARGE command.

In operation, a valid WRITE command is initiated, for example, with the CS*, CAS*, and WE* signals low and the RAS* signal high on the rising edge of a CLK signal. Upon receiving a WRITE command, a column address counter/latch 40 receives through the address register 42 a value representing a column address C0-C7 as indicated by the state of inputs A0-A7. This value is sent to the column decoder 46 which activates the relevant columns along with the sense amps 50 and I/O gating circuitry. This is accomplished through circuit block 48, which contains I/O gating, read data latch, and write driver circuitry. The data to be written to the cell addressed by the active row and column lines comes from data signals DQ0-DQ15 of data bus 24 through a data input register 54 as depicted in FIG. 1B. Circuit block 48, however, also contains DQM mask logic. As a result, writing to the memory array 22 is subject to the state of the DQM input. Specifically, if the DQM signal is low, the corresponding data will be written to memory. Alternatively, if the DQM is high, the corresponding data inputs will be ignored, and a write to the memory array 22 will not be executed to the particular byte/column location.

In operation, a valid READ command is used to initiate, for example, a burst read access to an active page or row. The READ command is initiated, for example, with low CS* and CAS* signals and high RAS* and WE* signals on the rising edge of the CLK signal. In response to a READ command, the column address counter/latch 40 receives column address bits from inputs A0-A9 and holds that column address. In response to the next CLK signal after the READ command, the column address counter/latch 40 latches the column address to the appropriate column decoder 46. The column decoder 46, in turn, activates the relevant columns in the memory array 22 along with the appropriate sense amps 50 and I/O gating circuitry in circuit block 48. As known in the art, the sense amps 50 and the I/O gating circuitry in circuit block 48 operate to sense the data stored in the cells addressed by the active row and column decoder lines and to provide the selected sixteen bits of data from the chosen memory array to a data output register 52 (FIG. 1B). With each progressive clock cycle, the column address counter/latch 40 increases the address by one, and the reading cycle begins again with the selected memory location. This cycle continues until the burst read access is completed or another command has been initiated to halt the burst READ. Data addressed by the READ command appears on pins DQ0-DQ15 and is subject to the status of the DQM signal. Specifically, in the present embodiment, DQM is low for DQ0-DQ15 to provide valid data.

The control logic initiates a PRECHARGE command in response to low CS*, WE* and RAS* signals along with a high CAS* signal on the rising edge of a CLK signal. The PRECHARGE command deactivates and precharges the memory array 22 at the time PRECHARGE is initiated. This makes the address bits a "don't care" (illustrated as reserved "res" bits) during the PRECHARGE command as illustrated in FIG. 2. Thus, a previously accessed row in the memory array 22 can be deactivated and precharged so that another page or row in that memory array 22 may be refreshed or activated. However, because a page or row in the memory array 22 activates in response to an ACTIVE command and remains active until receiving a PRECHARGE command, consecutive READ and WRITE commands to the same page or row in the memory array 22 do not require intervening PRECHARGE commands. Once the memory array 22 has been precharged, it is in an idle state and needs to be reactivated before another READ or WRITE command is issued to the memory array.

A REFRESH command is also used during normal operation of the SDRAM 20 and is initiated, for example, by registering CS*, RAS* and CAS* low with WE* high. The REFRESH command is non-persistent, and therefore, in the present embodiment, needs to be issued each time a refresh is required. Addressing is accomplished through the use of a refresh controller (not shown) and a refresh counter 56 in a known manner. This also makes the address bits a "don't care" (illustrated as reserved "res" bits) during the REFRESH command as illustrated in FIG. 2. The exemplary SDRAM 20 depicted in FIGS. 1A and 1B requires one REFRESH cycle for every page or row, for example, 32,768 REFRESH cycles every refresh period of the memory array 22. As a result, the SDRAM 20 provides a distributed REFRESH command once every refresh period to ensure that each row is properly refreshed. Alternatively, 32,768 REFRESH commands could be issued in a burst once every refresh period.

As apparent in FIG. 1A, an increase in the density of memory array 22 results in an increase in the quantity of external interconnections (e.g., pins) for routing address inputs A0-A14. Such an increase in the quantity of interconnections undesirably results in an increase in the size of the overall memory device and the dimension of the interface that is supported by other interfacing components, such as other members of a chip set. Accordingly, the various embodiments provide a method and apparatus for reducing the quantity of external interconnections (e.g., pins) that are used to support a memory device interface without significantly impacting the performance of the memory device.

Figure 3A:
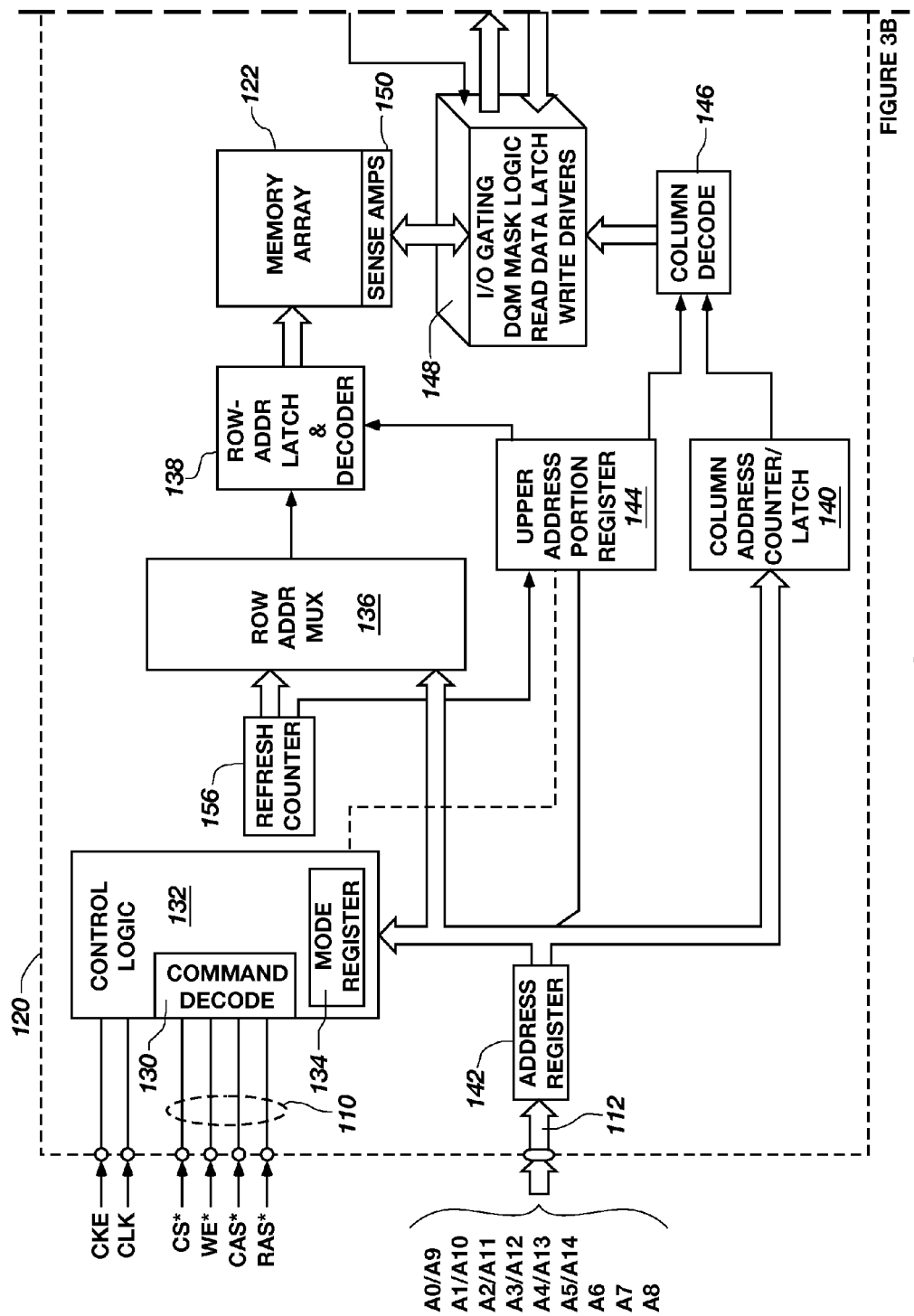
FIGS. 3A and 3B illustrate a block diagram of an SDRAM circuit, in accordance with an embodiment of the present invention.
Figure 3B:
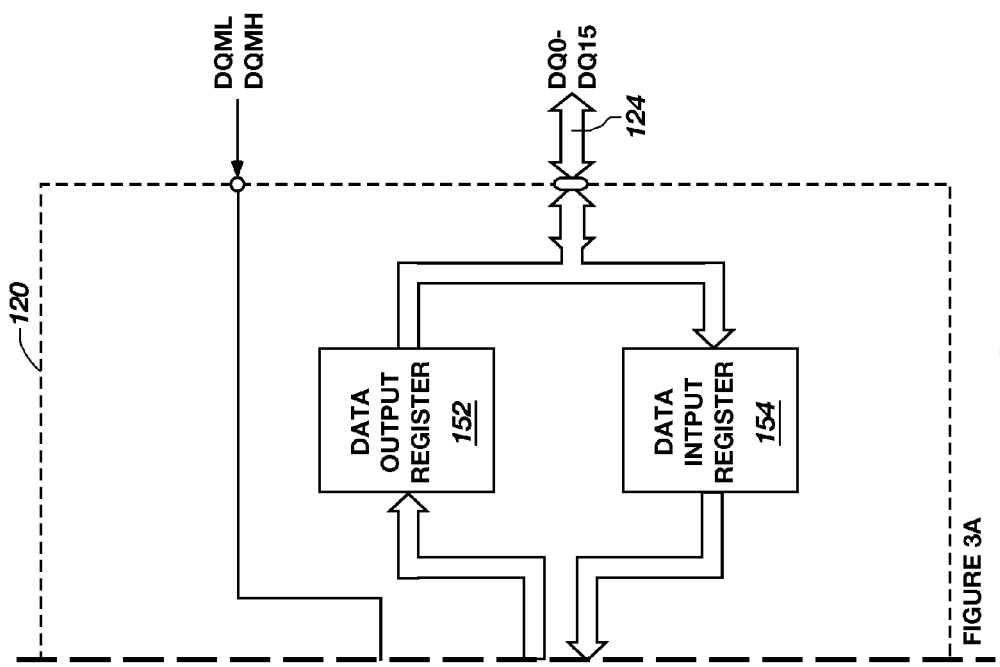

FIGS. 3A and 3B depict a block diagram of a representative memory system including an SDRAM, in accordance with an embodiment of the present invention. SDRAM 120 includes, for example, storage cells forming a memory array 122 organized in 32,768 rows and thirty-two 8-bit columns. Like the embodiment described above, a system clock signal CLK is provided through a CLK input pin, and a clock enable signal CKE is provided through a CKE pin of SDRAM 120. Furthermore, a chip select signal (CS*) is input through a CS* input pin. When CS* is low, for example, it enables a command decoder 130. Command decoder 130 is included as a part of control logic circuitry 132 and receives control signals. These control signals include a row address strobe (RAS*), a column address strobe (CAS*), and a write enable signal (WE*). The command decoder 130 decodes RAS*, CAS*, and WE* to place the control logic circuitry 132 in a particular command operation mode, as described above.

With respect to FIG. 1A, the address bits included an interconnection pin for each of the address signals, for example address signals A0-A14, requiring a total of fifteen dedicated interconnection pins. In contrast, the embodiment illustrated in FIG. 3A requires a lesser number of address interconnection pins, for example, nine dedicated address signals, namely, A0/A9, A1/A10, A2/A11, A3/A12, A4/A13, A5/A14, A6, A7, and A8. While external interconnections (e.g., pins) are shared between a portion of the address signals, all of the address signals A0-A14 are internally provided for page or row addresses. During a WRITE operation, data to be stored is supplied to SDRAM 120 through input/output pins DQ0-DQ15. During a READ operation, data is clocked out of SDRAM 120 through DQ0-DQ15. An input/output mask signal DQM is provided as an input mask signal for write operations and as an output enable signal during read operations.

According to various embodiments, the activation process is partitioned into two phases. Generally, one phase provides an upper portion of the address signals to the memory device from a controller while a second phase provides the lower portion of the address signals to the memory device from a controller. While increasing the activation process to include an additional phase may appear to increase the duration of the activation process thereby introducing latency, various embodiments generally embed one of the phases in an existing command such as a PRECHARGE or REFRESH without introducing any additional latency in the activation process. Specifically, various embodiments include an ACTIVE_UPPER (ACT_U) command and an ACTIVE_LOWER (ACT_L) command. These commands are decoded by a mode register 134 is a part of control logic circuitry 132 that defines the specific mode of operation of SDRAM 120. Based on the state of input signals CS*, RAS*, CAS*, and WE*, the mode register 134 will determine whether the SDRAM 120 is in an ACTIVE_UPPER, ACTIVE_LOWER, WRITE, READ, PRECHARGE, or REFRESH mode.

According to various embodiments, the ACTIVE_UPPER, PRECHARGE and REFRESH commands transmit the upper portion of the page or row address, which is latched within the SDRAM 120 during first phase of the activation process. Since the conventional PRECHARGE and REFRESH commands are sparsely populated in the concurrent signals input on the address bus, various embodiments utilize unused portions of the address bus for inputting the upper portion of the address signals utilizing these commands.

In conjunction with FIGS. 3A and 3B, FIG. 4 depicts a partial command structure for accessing the memory system, according to the various embodiments described herein. As stated, in the present embodiment, before any READ or WRITE command can be issued to a memory array, a row in that array must be activated. This is accomplished through a two-cycle activation process. For an activation process following a period of memory array inactivity, the ACTIVE_UPPER command, which is initiated by a combination of control signals such as CS*, RAS*, CAS* and WE* signals occurs during the rising edge of the CLK signal. During the first phase of the activation process, the ACTIVE_UPPER command and address values representing the upper portion of the page or row address, for example, address inputs A9-A14, as illustrated in FIG. 4, are sent to upper address portion register 144 through address register 142 and latched into the upper address portion register 144.

In the second phase of the activation process, the ACTIVE_LOWER command, which is initiated by a combination of control signals such as CS*, RAS*, CAS* and WE* signals, occurs during the rising edge of the CLK signal. During the second phase of the activation process, the ACTIVE_LOWER command and address values representing the lower portion of the page or row address, for example, address inputs A0-A8 and are sent to row address multiplexer 136, again by way of address register 142. The row address multiplexer 136, in turn, provides the lower portion of page or row address inputs to latch and decoder circuitry 138, corresponding to the appropriate memory page. Accordingly, the latch and decoder circuitry 138 will latch the upper and lower portions of the row address identified by inputs A0-A14, decode the row address, and activate one of the memory device's 32,768 pages or row lines, for example, corresponding to that address. According to the present embodiment, a subsequent activation process to a different page or row in the same memory array 122 is issued after the previous active page or row has been closed with a PRECHARGE command.

In operation, a valid WRITE command is initiated, for example, with the CS*, CAS*, and WE* signals low and the RAS* signal high on the rising edge of a CLK signal. Upon receiving a WRITE command, a column address counter/latch 140 receives through the address register 142 a value representing a column address as indicated by the state of inputs A0-A7. This value is sent to a column decoder 146 which activates the relevant columns along with the sense amps 150 and I/O gating circuitry. This is accomplished through circuit block 148, which contains I/O gating, read data latch, and write driver circuitry. The data to be written to the cell addressed by the active page or row and column lines comes from data signals DQ0-DQ15 of data bus 124 through a data input register 154 as depicted in FIG. 3B. Circuit block 148, however, also contains DQM mask logic. As a result, writing to the memory array 122 is subject to the state of the DQM input. Specifically, if the DQM signal is low, the corresponding data will be written to memory. Alternatively, if the DQM is high, the corresponding data inputs will be ignored, and a WRITE will not be executed to the particular byte/column location.

In operation, a valid READ command is used to initiate, for example, a burst read access to an active page or row. The READ command is initiated, for example, with low CS* and CAS* signals and high RAS* and WE* signals on the rising edge of the CLK signal. In response to a READ command, the column address counter/latch 140 receives column address bits from inputs A0-A9 and holds that column address. In response to the next CLK signal after the READ command, the column address counter/latch 140 latches the column address to the appropriate column decoder 146. The column decoder 146, in turn, activates the relevant columns in the memory array 122 along with the appropriate sense amps 150 and I/O gating circuitry in circuit block 148. As known in the art, the sense amps 150 and the I/O gating circuitry in circuit block 148 operate to sense the data stored in the cells addressed by the active row and column decoder lines and to provide the selected sixteen bits of data to a data output register 152 (FIG. 3B). With each progressive clock cycle, the column address counter/latch 140 increases the address by one, and the reading cycle begins again with the selected memory location. This cycle continues until the burst is completed or another command has been initiated to halt the burst READ. Data addressed by the READ command appears on pins DQ0-DQ15 subject to the status of the DQM signal. Specifically, in the present embodiment, DQM is low for DQ0-DQ15 to provide valid data.

The control logic initiates a PRECHARGE command in response to low CS*, WE* and RAS* signals along with a high CAS* signal on the rising edge of a CLK signal. The PRECHARGE command deactivates and precharges the memory array 122 at the time PRECHARGE is initiated. Since a PRECHARGE command is issued in anticipation of a subsequent change in page or row in the memory array, the address bits in the present embodiments are utilized to concurrently send the upper portion of the memory address A9-A14, for example, as illustrated in FIG. 4. Thus, a previously accessed row in the memory array 122 can be deactivated and precharged so that another page or row in that memory array 122 may be refreshed or activated. However, because a page or row in the memory array 122 activates in response to an activate command and remains active until receiving a PRECHARGE command, consecutive READ and WRITE commands to the same page or row in the memory array 122 do not require intervening PRECHARGE commands. Once the memory array 122 has been precharged with the upper portion of the memory address A9-A14, for example, and latched into the upper address portion register 144, in the present embodiment, the memory array is in an idle state and is reactivated with an ACTIVE_LOW command including the lower portion of the memory address A0-A8, for example, before another READ or WRITE command is issued to the memory array.

A REFRESH command is also used during normal operation of the SDRAM 120 and is initiated by asserting CS*, RAS* and CAS* low with WE* high. The REFRESH command is non-persistent, and therefore in the present embodiment, is issued each time a refresh is required. Addressing is accomplished through the use of a refresh controller (not shown) and a refresh counter 156 in a known manner. Since a REFRESH command is issued in anticipation of a subsequent change in page or row in the memory array, the address bits in the present embodiments are utilized to concurrently send the upper portion of the memory address A9-A14, for example, as illustrated in FIG. 4. The SDRAM 120 depicted in FIGS. 3A and 3B requires one REFRESH cycle for every page or row, for example, 32,768 REFRESH cycles every refresh period of the memory array 122.

As apparent in FIG. 3A, an increase in the density of memory array 122 does not necessarily result in an increase in the quantity of interconnections (e.g., pins) for routing address inputs A0-A14 since portions of the address inputs are sent in reserved ("res") or "don't care" fields of existing commands. Accordingly, various embodiments provide a method and apparatus for reducing the quantity of interconnections (e.g., pins) that are necessary to support a memory device interface without significantly impacting the performance of the memory device.

Figure 5:
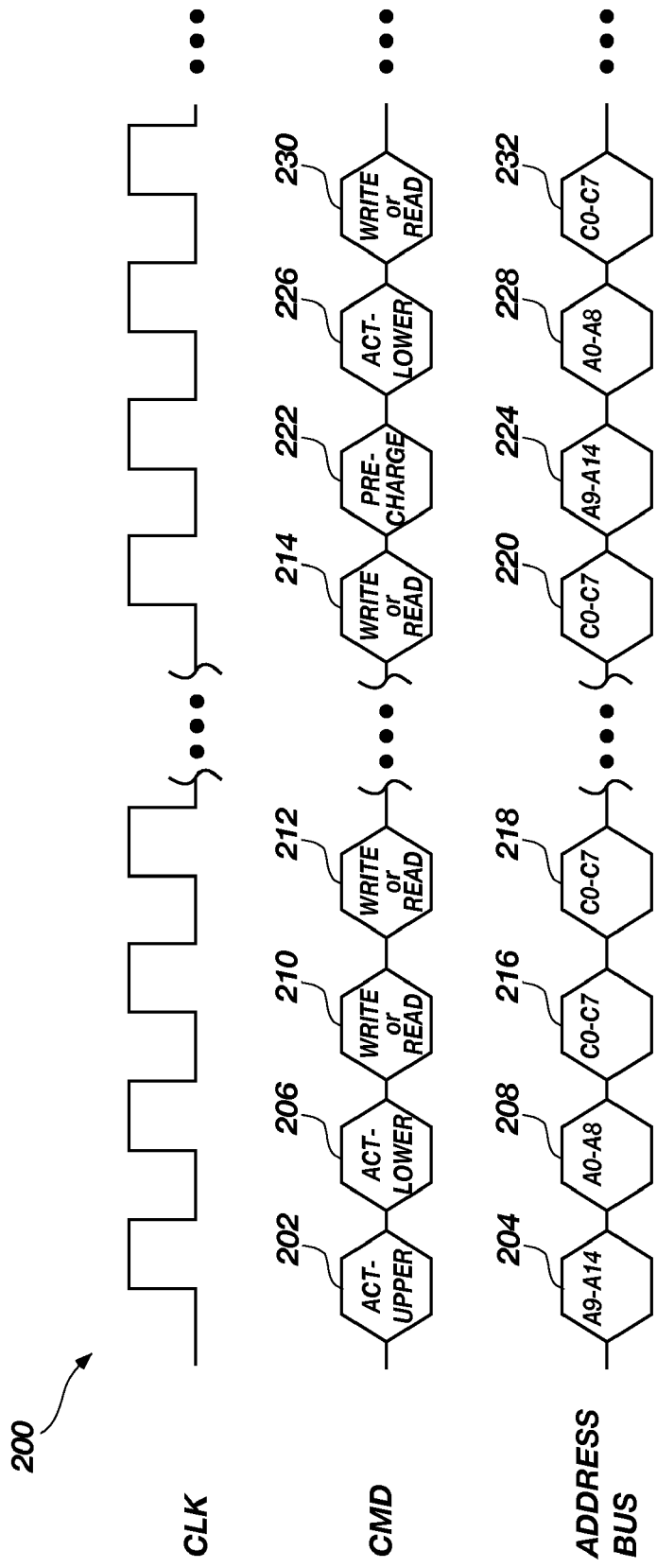
FIG. 5 is a timing diagram illustrating timing signals of a command and address bus of a memory device, in accordance with an embodiment of the present invention.

FIG. 5 is a timing diagram 200 illustrating an initial activation following an idle period, in accordance with an embodiment. As stated, when a page or row of memory cells is accessed, in the present embodiment, an ACTIVE command for that page or row must first be asserted. Various embodiments utilize a two-cycle activation process. For an activation process following a period of memory array inactivity, any ACTIVE_UPPER command 202 occurs during the first phase of the activation process. The ACTIVE_UPPER command 202, on the command bus 110 of FIG. 3A, is concurrently issued with address values 204, on the address bus 112 of FIG. 3A, representing the upper portion of the page or row address. The address inputs A9-A14, for example, are sent to upper address portion register 144 through address register 142 and latched into the upper address portion register 144 of FIG. 3A.

In the second phase of the activation process, the ACTIVE_LOWER command 206 occurs during the second phase of the activation process. The ACTIVE_LOWER command 206, on the command bus 110 of FIG. 3A, is concurrently issued with address values 208, on the address bus 112 of FIG. 3A, representing the lower portion of the page or row address. The address inputs A0-A8, for example, are sent to row address multiplexer 136, again by way of address register 142 of FIG. 3A. The row address multiplexer 136, in turn, provides the lower portion of page or row address inputs to latch and decoder circuitry 138 corresponding to the appropriate memory page. Accordingly, the latch and decoder circuitry 138 will latch the upper and lower portions of the row address inputs identified by inputs A0-A14, decode the row address, and activate one of the memory device's 32,768 pages or row lines corresponding to that address. Once the page or row of lines are activated, one or more WRITE or READ commands 210-214 are sequentially issued on the command bus 112 of FIG. 3A with column C0-C7 values 216-220 representing the bytes of data along the page of memory cells in the memory device being concurrently issued on the address bus 112 of FIG. 3A.

In the precharge process, a PRECHARGE command 222 occurs and deactivates and precharges the memory array 122 of FIG. 3A. Since a PRECHARGE command 222 is issued in anticipation of a subsequent change in page or row in the memory array, the address values 224, on the address bus 112 of FIG. 3A, are concurrently issued and represent the upper portion of the page or row address of the next page that is to be written to or read from. As stated, the address inputs A9-A14, for example, are sent to upper address portion register 144 through address register 142 and latched into the upper address portion register 144 of FIG. 3A. Therefore, the PRECHARGE command 222 in various embodiments serves as an ACTIVE_UPPER command 202 to provide the upper portion of the page or row address of the next page of memory of the activation process.

In the second phase of the activation process, the ACTIVE_LOWER command 226 occurs during the second phase of the activation process. The ACTIVE_LOWER command 226, on the command bus 110 of FIG. 3A, is concurrently issued with address values 228, on the address bus 112 of FIG. 3A, representing the lower portion of the page or row address of the next page of memory to be activated. Once the page or row of lines of the next page are activated, one or more WRITE or READ commands 230 is issued on the command bus 112 of FIG. 3A with column C0-C7 values 232 representing the bytes of data along the page of memory cells in the memory device being concurrently issued on the address bus 112 of FIG. 3A.

Figure 6:
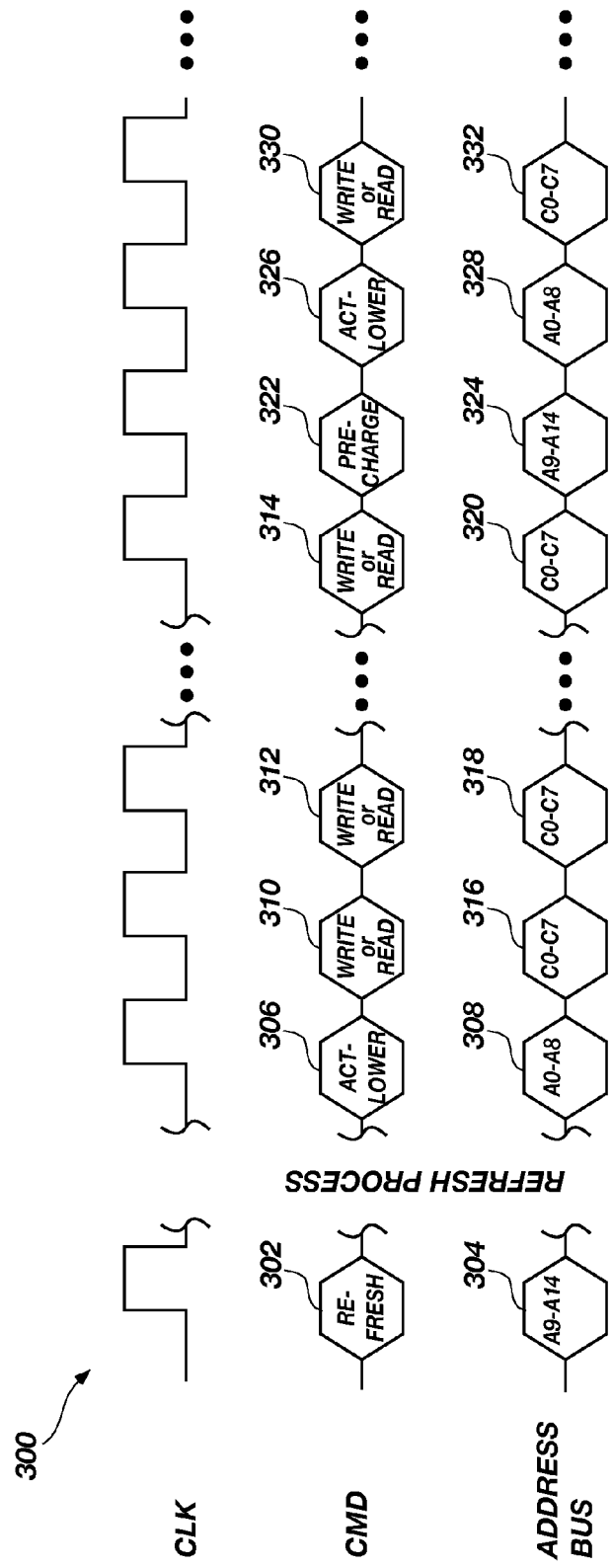
FIG. 6 is a timing diagram illustrating timing signals of a command and address bus of a memory device, in accordance with an embodiment of the present invention.

FIG. 6 is a timing diagram 300 illustrating an activation following a refresh process, in accordance with an embodiment. As stated, in the present embodiment, when a page or row of memory cells is accessed, an activation command for that page or row must first be asserted. Various embodiments utilize a two-cycle activation process. For an activation process following a refresh process, a REFRESH command 302 is utilized as the first phase of the activation process. The REFRESH command 302, on the command bus 110 of FIG. 3A, is concurrently issued with address values 304, on the address bus 112 of FIG. 3A, representing the upper portion of the page or row address. The address inputs A9-A14, for example, are sent to upper address portion register 144 through address register 142 and latched into the upper address portion register 144 of FIG. 3A. The refresh process then continues to completion.

In the second phase of the activation process, an ACTIVE_LOWER command 306 occurs during the second phase of the activation process. The ACTIVE_LOWER command 306, on the command bus 110 of FIG. 3A, is concurrently issued with address values 308, on the address bus 112 of FIG. 3A, representing the lower portion of the page or row address. The address inputs A0-A8, for example, are sent to row address multiplexer 136, again by way of address register 142 of FIG. 3A. The row address multiplexer 136, in turn, provides the lower portion of page or row address inputs to latch and decoder circuitry 138 corresponding to the appropriate memory page. Accordingly, the latch and decoder circuitry 138 will latch the upper and lower portions of the row address identified by inputs A0-A14, decode the row address, and activate one of the memory device's 32,768 pages or row lines corresponding to that address. Once the page or row of lines are activated, one or more WRITE or READ commands 310-314 are sequentially issued on the command bus 110 of FIG. 3A with column C0-C7 values 316-320 representing the bytes of data along the page of memory cells in the memory device being concurrently issued on the address bus 112 of FIG. 3A.

In the precharge process, a PRECHARGE command 322 occurs and deactivates and precharges the memory array 122 of FIG. 3A. Since a PRECHARGE command 322 is issued in anticipation of a subsequent change in page or row in the memory array, address values 324, on the address bus 112 of FIG. 3A, are concurrently issued and represent the upper portion of the page or row address of the next page that is to be written to or read from. As stated, the address inputs A9-A14, for example, are sent to upper address portion register 144 through address register 142 and latched into the upper address portion register 144 of FIG. 3A. Therefore, the PRECHARGE command 322 in various embodiments also serves like the REFRESH command 302 or an ACTIVE_UPPER command 202 of FIG. 5 to provide the upper portion of the page or row address of the next page of memory of the activation process.

In the second phase of the activation process, the ACTIVE_LOWER command 326 occurs during the second phase of the activation process. The ACTIVE_LOWER command 326, on the command bus 110 of FIG. 3A, is concurrently issued with address values 328, on the address bus 112 of FIG. 3A, representing the lower portion of the page or row address of the next page of memory to be activated. Once the page or row of lines of the next page are activated, one or more WRITE or READ commands 330 is issued on the command bus 112 of FIG. 3A with column C0-C7 values 332 representing the bytes of data along the page of memory cells in the SDRAM 120 being concurrently issued on the address bus 112 of FIG. 3A.

Figure 7:
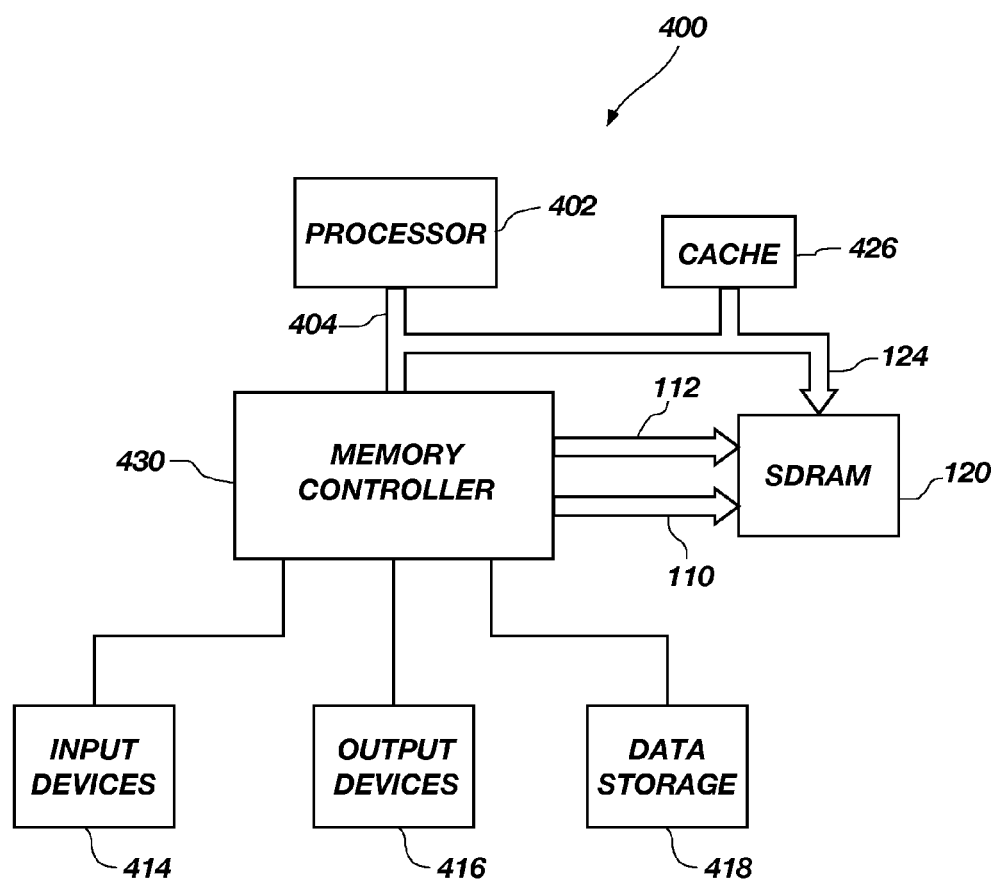
FIG. 7 is a block diagram of a system, in accordance with an embodiment of the present invention.

FIG. 7 illustrates an embodiment of an electronic system 400 that incorporates the SDRAM 120, or some other memory device including an embodiment of the memory device command structure, for reducing the quantity of inputs of a memory device as described herein. The electronic system 400 includes a processor 402 for performing various computing functions, such as executing specific software to perform specific calculations or tasks. The processor 402 includes a processor bus 404 that conventionally includes an address bus, a control bus, and a data bus. In addition, the electronic system 400 includes one or more input devices 414, such as a keyboard or a mouse, coupled to the processor 402 to allow an operator to interface with the electronic system 400. As is conventional, the electronic system 400 also includes one or more output devices 416 coupled to the processor 402, such output devices typically being a printer or a video terminal. One or more data storage devices 418 are also coupled to the processor 402 to store data or retrieve data from external storage media (not shown). The processor 402 is also coupled to a cache memory 426 and to the SDRAM 120 through a memory controller 430. The memory controller 430 includes a bus coupled to the address bus 112 (FIG. 3A) to couple row addresses and column addresses to the memory device 120, as previously explained. The memory controller 430 also includes a control bus that couples control signals to a command bus 110 (FIG. 3A) of the SDRAM. The data bus 124 (FIG. 3B) of the memory device 120 is coupled to the data bus of the processor 402, either directly or through the memory controller 430. The memory controller 430 applies appropriate control signals (e.g., ACTIVE_UPPER, ACTIVE_LOWER, WRITE, READ, PRECHARGE, or REFRESH) to the memory device 120 to cause the memory device 120 to operate as described hereinabove.

Although the present invention has been described with reference to particular embodiments, the invention is not limited to these described embodiments. Rather, the invention is limited only by the appended claims and their legal equivalents.

What is claimed is:

1. A memory device, comprising:
   at least first and second pages of memory cells; and
   a controller and address and command buses configured to cooperatively receive a first portion of an address of the second page of memory cells while executing commands relating to the first page of memory cells, the commands including a precharge command, in response to which an open page of memory cells is at least partially closed.

2. The memory device of claim 1, wherein the commands relating to the first page of memory cells include a refresh command to refresh at least one other page of memory cells.

3. The memory device of claim 1, further comprising a register for storing the first portion of the address of the second page until the controller receives an activate command including a second portion of the address of the second page of memory cells.

4. The memory device of claim 1, wherein the first portion of the address comprises an upper address portion.

5. The memory device of claim 1, wherein the at least first and second pages of memory cells are included in a greater plurality of pages of memory cells addressable by a first number of address signals, and the address bus includes a second number of address lines less than the first number of address signals.

6. A memory device, comprising:
   a plurality of pages of memory cells addressable by a first quantity of address signals;
   an address bus including a second quantity of address lines, wherein the second quantity is less than the first quantity; and
   a controller and command bus cooperatively coupled with the plurality of pages of memory cells and the address bus, the memory device configured to receive a difference portion of address signals relating to a subsequent page of memory cells, the difference portion being a difference between the first quantity of address signals and the second quantity of address lines while executing commands relating to a current page of the plurality of pages of memory cells, wherein at least one of the commands includes a precharge command, in response to which an open page of memory cells is at least partially closed.

7. An electronic system, comprising:
   a controller; and
   a memory device including a plurality of pages of memory cells being configured to embed a portion of an address of a subsequent page of the plurality of pages of memory cells in a command pertaining to a current page of the plurality of pages of memory cells, wherein the command includes a precharge command, in response to which an open page of memory cells is at least partially closed.

8. The electronic system of claim 7, wherein the command pertaining to the current page of the plurality of pages of memory cells includes a refresh command.

9. The electronic system of claim 7, further comprising a register to buffer an embedded portion of the address of the subsequent page pending receipt of an activate command including a remaining portion of the address.

10. The electronic system of claim 7, wherein the portion of the address of the subsequent page comprises an upper address portion.

11. The electronic system of claim 7, wherein the plurality of pages of memory cells are addressable by a first number of address signals, and further including an address bus having a second number of address lines less than the first number of address signals.

* * * * *